(12) United States Patent
Wang et al.

(10) Patent No.: US 10,700,694 B2
(45) Date of Patent: Jun. 30, 2020

(54) CALIBRATION METHOD AND RELATED CALIBRATION SYSTEM

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Ting-Hao Wang, Hsinchu (TW); Yu-Chu Chen, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/451,019

(22) Filed: Jun. 25, 2019

(65) Prior Publication Data

US 2020/0127676 A1    Apr. 23, 2020

(30) Foreign Application Priority Data

Oct. 17, 2018 (TW) .............................. 107136586 A

(51) Int. Cl.
*H03M 1/10* (2006.01)
*H03M 1/38* (2006.01)

(52) U.S. Cl.
CPC ........... *H03M 1/1033* (2013.01); *H03M 1/38* (2013.01)

(58) Field of Classification Search
CPC ........ H03M 1/1245; H03M 1/12; H03M 1/46; H03M 1/38; H03M 1/462; H03M 1/466; H03M 1/1009; H03M 1/06; H03M 1/1215; H03M 1/1038; H03M 1/0607; H03M 3/378; H03M 3/38
USPC ................................. 341/118–121, 155, 172
See application file for complete search history.

(56) References Cited

U.S. PATENT DOCUMENTS

| 4,399,426 A | * | 8/1983 | Tan | H03M 1/183 341/120 |
| 6,707,403 B1 | * | 3/2004 | Hurrell | H03M 1/1061 341/120 |
| 6,856,174 B1 | * | 2/2005 | Fontaine | H03M 1/1014 327/100 |

(Continued)

OTHER PUBLICATIONS

"A Calibration Technique for SAR ADC Based on Code Density Test" Xinan Gu Xiuju He, Fule Li, 2015 IEEE. (Year: 2015).*

(Continued)

*Primary Examiner* — Linh V Nguyen
(74) *Attorney, Agent, or Firm* — CKC & Partners Co., LLC

(57) ABSTRACT

A calibration method applicable for a SAR ADC comprising a capacitor array, comprises the following operations: Inputting an input signal to the SAR ADC, wherein the SAR ADC is configured to generate an output signal according to the input signal, and the output signal comprises multiple selected digital codes; calculating average code densities for multiple digital code groups, respectively, wherein the multiple digital code groups are determined by dividing the multiple selected digital codes, and each of the multiple digital code groups comprises one or more selected digital codes of the multiple selected digital codes; calibrating capacitance of a first under-correction capacitor element of the capacitor array according to the first comparison result.

14 Claims, 6 Drawing Sheets

(56) References Cited

U.S. PATENT DOCUMENTS

| | | | | |
|---|---|---|---|---|
| 8,223,044 B2* | 7/2012 | Snedeker | ............ | H03M 1/1047 |
| | | | | 341/118 |
| 8,446,304 B2* | 5/2013 | Scanlan | ............. | H03M 1/1004 |
| | | | | 341/120 |
| 9,571,115 B1* | 2/2017 | Beukema | ............ | H03M 1/1023 |
| 9,774,345 B1* | 9/2017 | Yoshioka | ............. | H03M 1/466 |
| 9,973,202 B2* | 5/2018 | Yoshioka | ............ | H03M 1/0656 |
| 10,218,377 B2* | 2/2019 | Bogner | ............... | H03M 1/1014 |
| 10,333,539 B2* | 6/2019 | Hsu | .................... | H03M 1/0607 |
| 10,483,995 B1* | 11/2019 | Lok | ....................... | H03M 1/468 |

OTHER PUBLICATIONS

X. Gu, X. He and F. Li, "A calibration technique for SAR ADC based on code density test," 2015 IEEE 11th International Conference on ASIC (ASICON), Chengdu, 2015, pp. 1-4.

* cited by examiner

US 10,700,694 B2

CALIBRATION METHOD AND RELATED CALIBRATION SYSTEM

CROSS-REFERENCE TO RELATED APPLICATION

This application claims priority to Taiwan Application Serial Number 107136586, filed Oct. 17, 2018, which is herein incorporated by reference in its entirety.

BACKGROUND

Field of Invention

The present disclosure relates to calibration method and related calibration system. More particularly, the present disclosure relates to a calibration method for the SAR ADC.

Description of Related Art

The successive approximation ADC (SAR ADC) has advantages such as low power consumption and small circuit area, and thus is widely used in today's electronic devices. The SAR ADC uses capacitor array to sample and successively approximate the input signal. Capacitance of each of the capacitors in the capacitor array has to be designed precisely according to powers of 2 in an ascending manner. For example, a 4-bit SAR ADC includes capacitor array having capacitors that have 8C, 4C, 2C, and 1C capacitance, respectively. If capacitance of the capacitor array deviates from the original design during the manufacture process, the SAR ADC will have erroneous output results.

SUMMARY

The disclosure provides a calibration method applicable for a SAR ADC comprising a capacitor array. The method comprises the following operations: Inputting an input signal to the SAR ADC, wherein the SAR ADC is configured to generate an output signal according to the input signal, and the output signal comprises multiple selected digital codes; calculating average code densities for multiple digital code groups, respectively, wherein the multiple digital code groups are determined by dividing the multiple selected digital codes, and each of the multiple digital code groups comprises one or more selected digital codes of the multiple selected digital codes; calibrating capacitance of a first under-correction capacitor element of the capacitor array according to the first comparison result.

The disclosure provides a calibration system comprising a SAR ADC, a code density calculation module, a code density examination module, and a capacitor calibration module. The SAR ADC comprises a capacitor array, and is configured to generate an output signal according to an input signal. The output signal comprises multiple selected digital codes. The code density calculation module is configured to receive the output signal, and to calculate average code densities for multiple digital code groups, respectively. The multiple digital code groups are determined by dividing the multiple selected digital codes, and each of the multiple digital code groups comprises one or more selected digital codes of the multiple selected digital codes. The code density examination module is configured to compare an average code density of a first target group selected from the multiple digital code groups with a first predetermined code density, and to output a first comparison result. The capacitor calibration module is coupled with the capacitor array, and configured to calibrate capacitance of a first under-correction capacitor element of the capacitor array according to the first comparison result.

It is to be understood that both the foregoing general description and the following detailed description are by examples, and are intended to provide further explanation of the disclosure as claimed.

DETAILED DESCRIPTION

Figure 1:
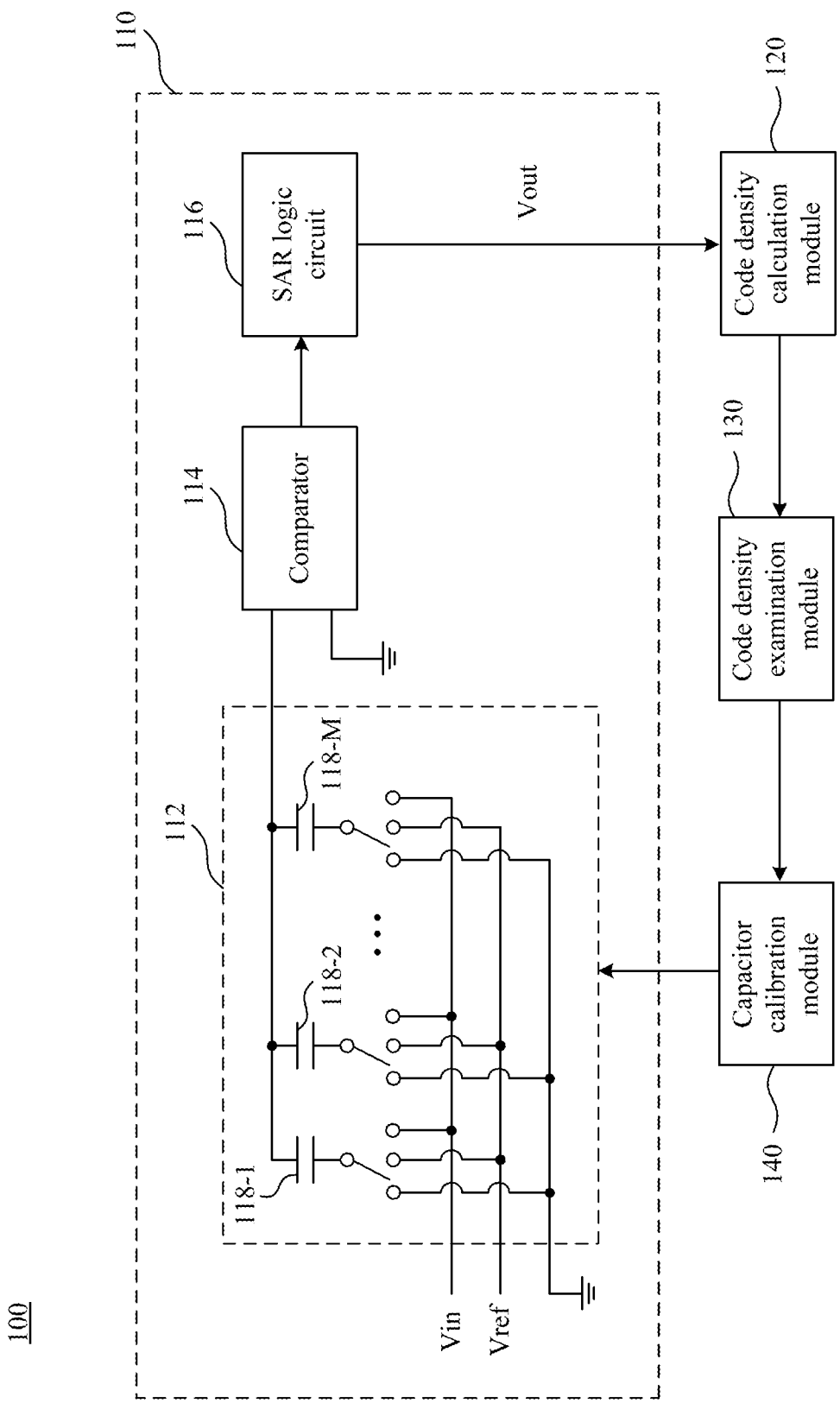
FIG. 1 is a simplified functional block diagram of a calibration system according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a simplified functional block diagram of a calibration system 100 according to one embodiment of the present disclosure. The calibration system 100 comprises a SAR ADC 110, a code density calculation module 120, a code density examination module 130, and a capacitor calibration module 140. The code density calculation module 120 and the capacitor calibration module 140 are coupled with the SAR ADC 110. The code density examination module 130 is coupled between the code density calculation module 120 and the capacitor calibration module 140. For the sake of brevity, other functional blocks of the calibration system 100 are not shown in FIG. 1.

The SAR ADC 110 comprises a capacitor array 112, a comparator 114, and a SAR logic circuit 116. The capacitor array 112 is coupled with the capacitor calibration module 140. Furthermore, the capacitor array 112 comprises M capacitor elements 118-1~118-M and M is a positive integer. The capacitor elements 118-1~118-M are each configured to selectively receive an input signal Vin, a reference voltage Vref, or a ground voltage.

In other words, the SAR ADC 110 is an M-bit ADC. The input signal Vin can be sampled and successively approximated by the cooperation between the capacitor array 112 and the comparator 114. According to the result of successive approximation, the SAR logic circuit 116 may output an output signal Vout corresponding to the magnitude of the input signal Vin.

Throughout the specification and drawings, indexes 1~M may be used in the reference labels of components and signals for ease of referring to respective components and signals. The use of indexes 1~M does not intend to restrict the amount of components and signals to any specific number. In the specification and drawings, if a reference label of a particular component or signal is used without having the index, it means that the reference label is used to refer to any unspecific component or signals of corresponding component group or signals group. For example, the reference label 118-1 is used to refer to the specific capacitor element 118-1, and the reference label 118 is used to refer to any unspecific capacitor element of the capacitor elements 118-1~118-M.

It should be noted that the output signal Vout comprises multiple digital codes. For example, in some embodiments that the SAR ADC 110 is a 4-bit ADC, the output signal Vout may comprise up to $2^4$ digital codes (e.g., digital codes 0000 through 1111). Accordingly, in the situation that the SAR ADC 110 is an M-bit ADC, the output signal Vout may comprise up to $2^M$ binary digital codes, and the $2^M$ binary digital codes are respectively corresponding to decimal values 0 through ($2^M-1$).

The code density calculation module 120 is configured to receive the output signal Vout, and to calculate code densities for the multiple selected digital codes of the output signal Vout, respectively. The code density examination module 130 is configured to select one or more digital codes from the multiple selected digital codes to form a target group. The code density examination module 130 is further configured to compare an average code density of the target group with a predetermined code density, and to output the comparison result to the capacitor calibration module 140.

If a difference, larger than a predetermined bias value, exists between the average code density of the target group and the predetermined code density, it represents that the capacitance of the multiple capacitor elements 118 of the capacitor array 112 deviate from the original design, or some components of the SAR ADC 110 have characteristic variations during the operation. In this situation, the capacitor calibration module 140 may calibrate a corresponding capacitor element 118 of the capacitor array 112 according to the selected target group and the related predetermined bias value.

Figure 2A:
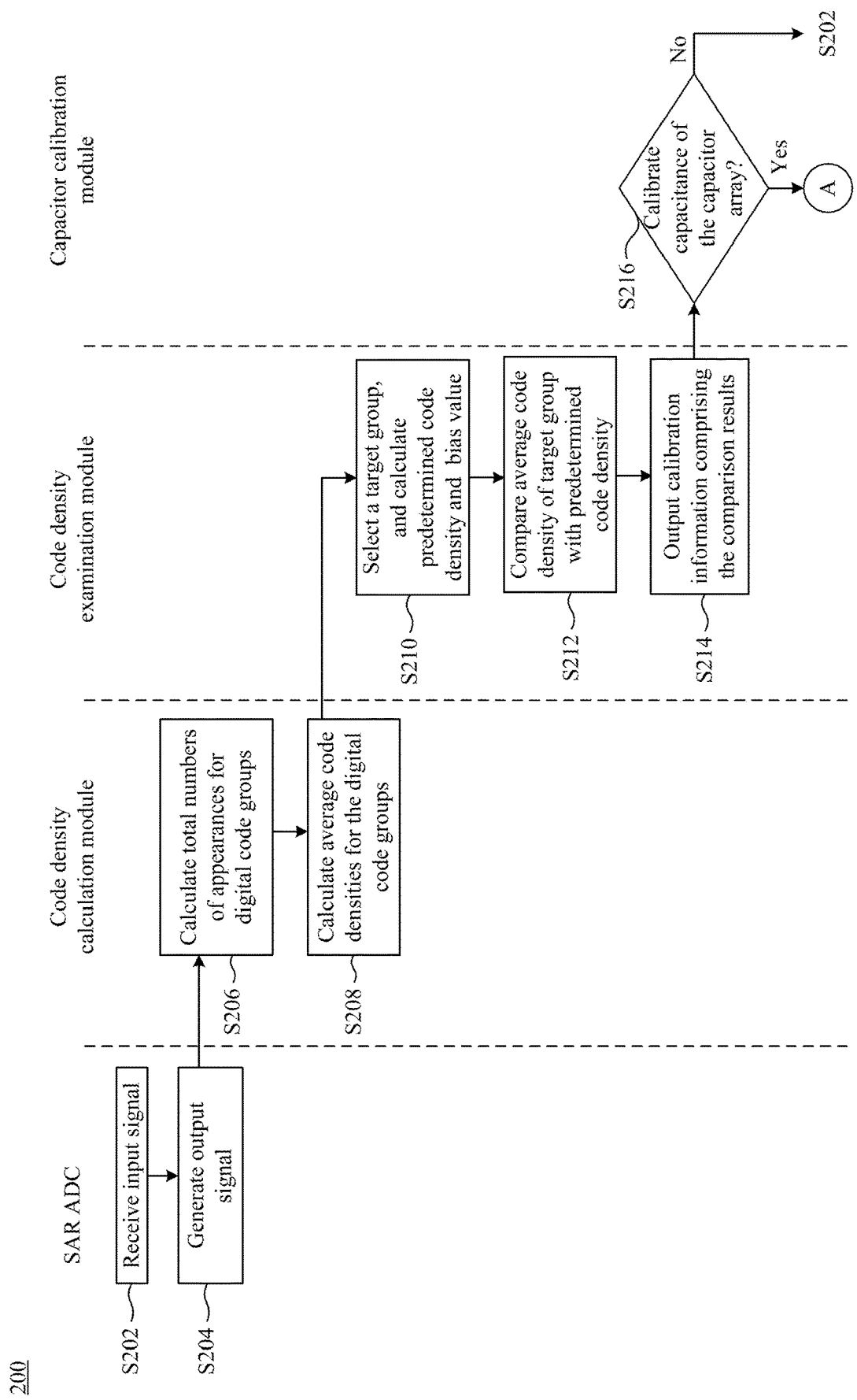
FIGS. 2A and 2B cooperatively show a simplified flowchart of a calibration method 200 according to one embodiment of the preset disclosure.
Figure 2B:
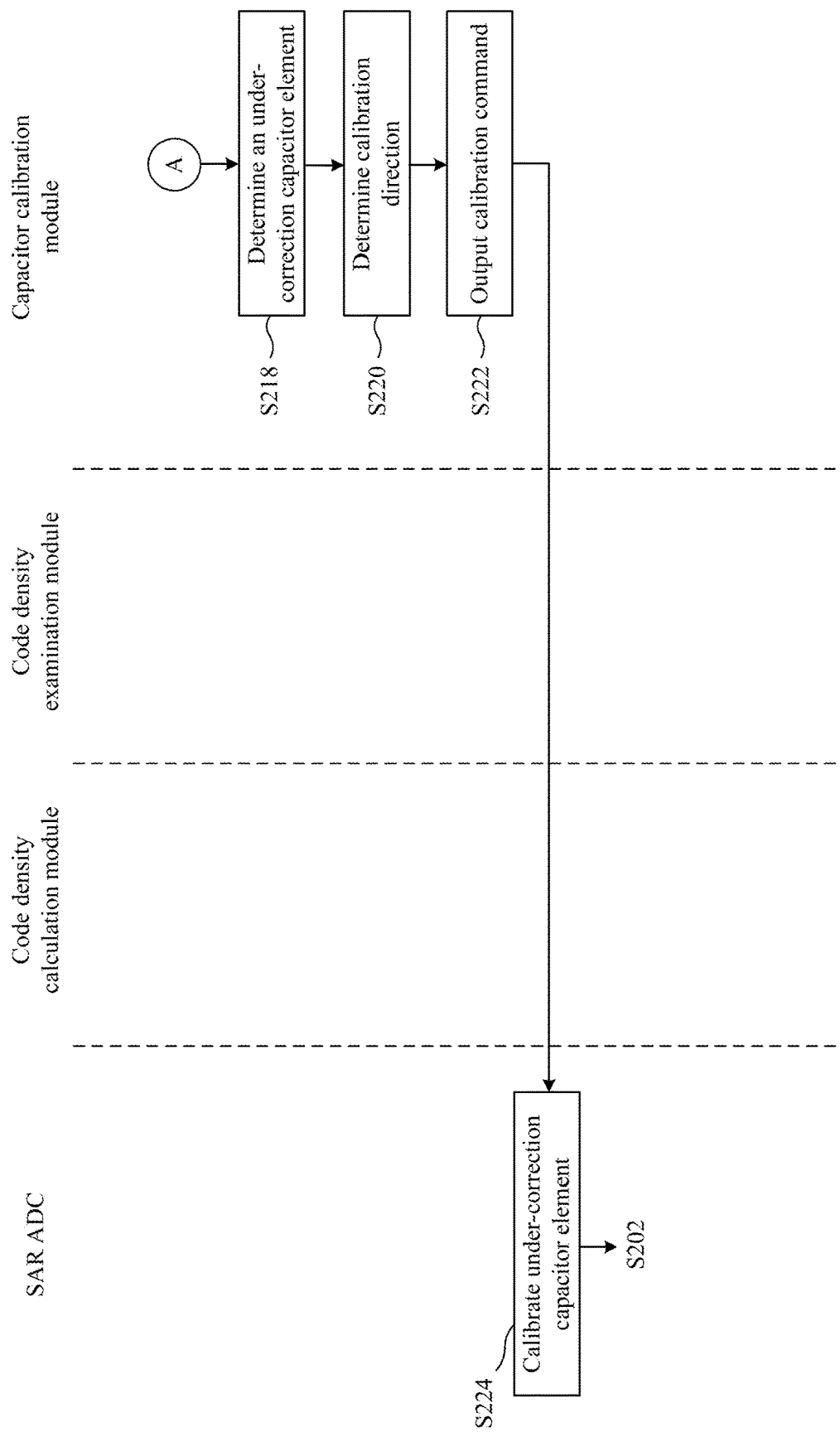

FIGS. 2A and 2B cooperatively show a simplified flowchart of a calibration method 200 according to one embodiment of the preset disclosure. The calibration system 100 may be configured to execute the calibration method 200 to calibrate the SAR ADC 110. The operation of the calibration system 100 will be further described in the following by reference to FIGS. 1 through 2B. In FIGS. 2A and 2B, operations within a column under the name of a specific device are operations to be performed by the specific device. For example, operations within a column under the label "SAR ADC" are operations to be performed by the SAR ADC 110, operations within a column under the label "code density examination module" are operations to be performed by the code density examination module 130, and so forth.

In operation S202, the SAR ADC 110 uses the capacitor array 112 to receive the input signal Vin. Then, in operation 204, the SAR ADC 110 uses the capacitor array 112 and the comparator 114 to perform the successive approximation to the input signal Vin, and uses the SAR logic circuit 116 to generate the output signal Vout according to the result of the successive approximation. The SAR logic circuit 116 also transmits the output signal Vout to the code density calculation module 120.

In this embodiment, the input signal Vin is a current or voltage signal complying with the full scale range of the SAR ADC 110. The input signal Vin, for example, may be a ramp signal or a sine wave signal.

In operation S206, the code density calculation module 120 counts, according to the received output signal Vout within a predetermined time period, total numbers of appearances for the multiple digital code groups, respectively.

Figure 3:
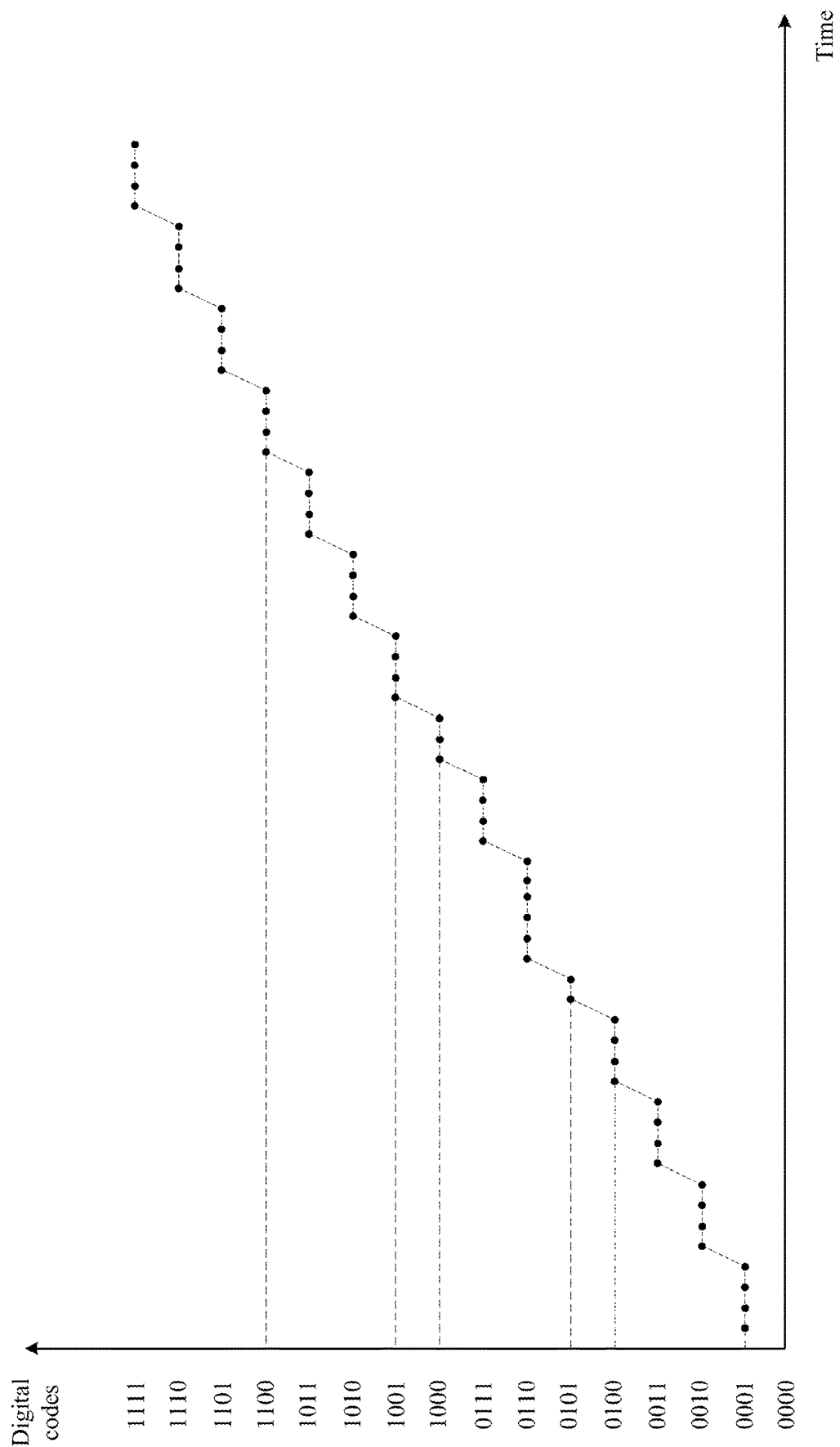
FIG. 3 is a schematic diagram of the output signal according to one embodiment of the present disclosure.

For example, in the situation that the SAR ADC 110 is a 4-bit ADC and the input signal Vin is a ramp signal, the output signal Vout is as shown in FIG. 3, and the output signal comprises selected digital codes 0001 through 1010. The code density calculation module 120 may calculate a total number of appearances (e.g., 16), within a predetermined time period, of a first digital code group (e.g., digital codes 0001 through 0100) in the selected digital codes to obtain a first cumulative number. Next, the code density calculation module 120 may calculate a total number of appearances (e.g., 15), within the same predetermined time period, of a second digital code group (e.g., digital codes 0101 through 1000) in the selected digital codes to obtain a second cumulative number. Then, the code density calculation module 120 may calculate a total number of appearances (e.g., 16), within the same predetermined time period, of a third digital code group (e.g., digital codes 1001 through 1100) in the selected digital codes to obtain a third cumulative number, and so forth. It should be noted that each of the digital code groups comprises one or more digital codes.

In operation S208, the code density calculation module 120 may calculate average code densities for the digital code groups, respectively, according to the total numbers of appearances of each of the digital code groups. For example, the aforementioned first digital code group has an average code density of 4, and the second digital code group has an average code density of 3.75.

Figure 4A:
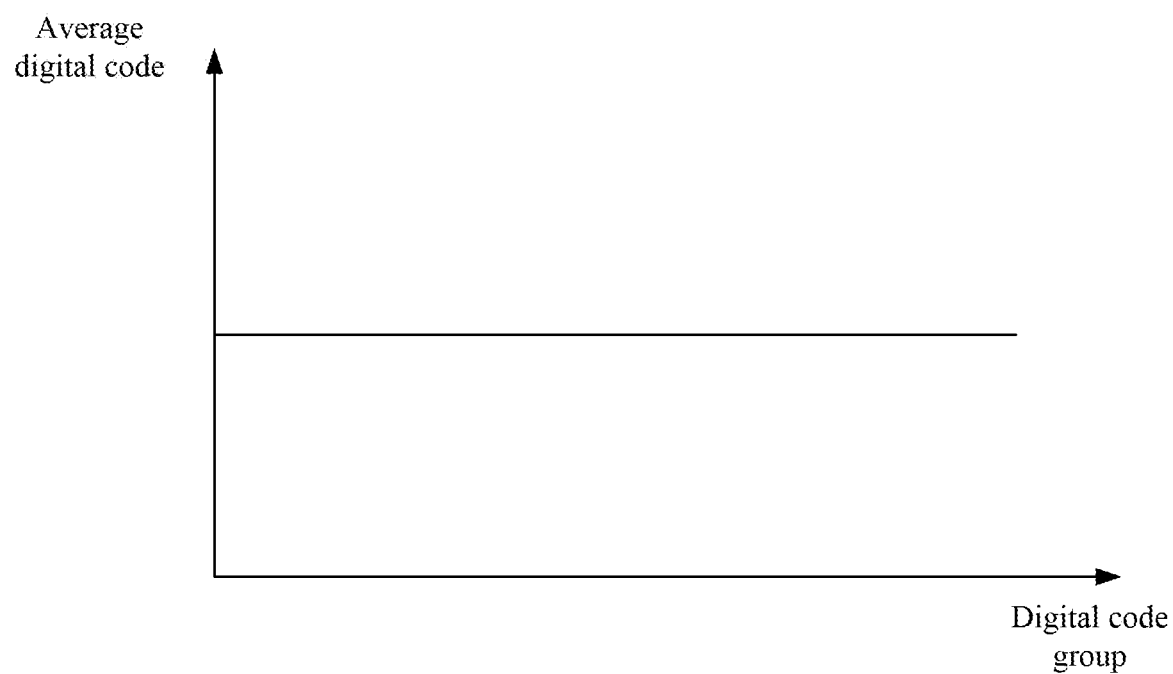
FIGS. 4A and 4B are histograms of the distributions of the average code densities according to embodiments of the present disclosure.
Figure 4B:
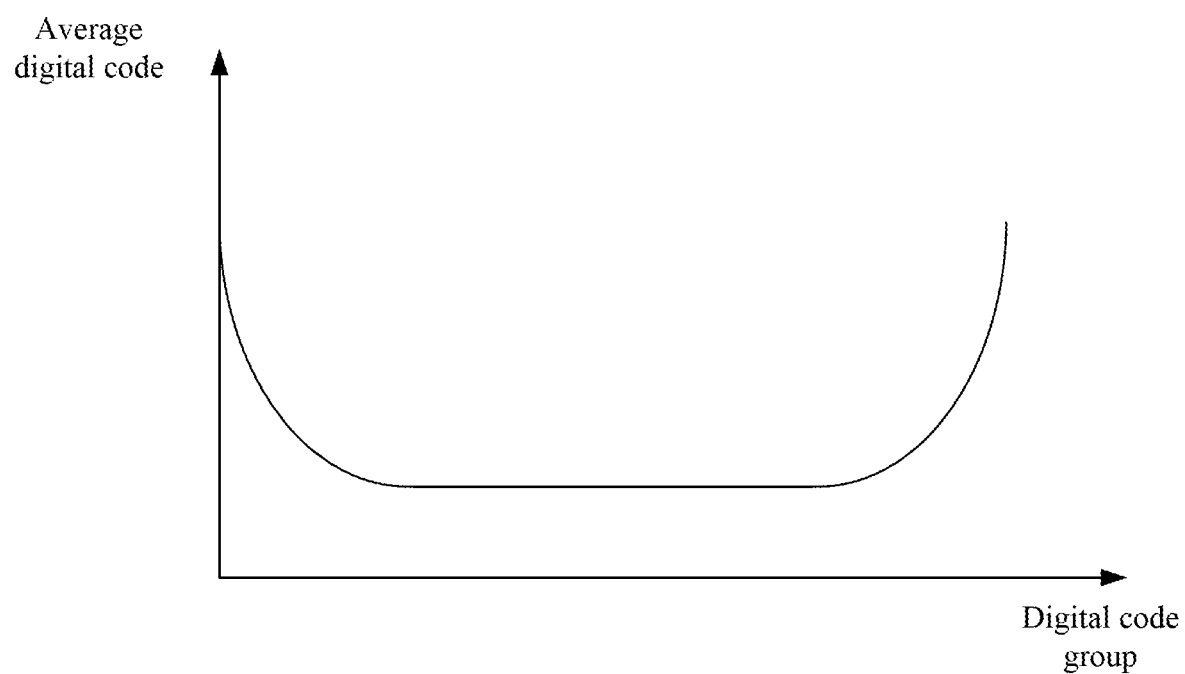

If the input signal Vin is a ramp signal, the average code densities calculated by the code density calculation module 120 present a flatten distribution as shown in FIG. 4A. On the other hand, if the input signal Vin is a sine wave signal, the average code densities calculated by the code density calculation module 120 present a bathtub distribution as shown in FIG. 4B.

In operation S210, the code density examination module 130 selects one of the multiple digital groups as a target group. For example, the code density examination module 130 may select one of the aforementioned first digital code group, second digital code group, and third digital code group as the target group. In addition, the code density examination module 130 calculates the predetermined code density and the predetermined bias value according to other digital code groups different from the target group. For example, the code density examination module 130 may calculate the predetermined code density and the predetermined bias value according to two of the first digital code group, the second digital code group, and the third digital code group that are different from the target group.

In specific, digital codes of the SAR ADC 110 are distributed in a range of binary numbers. As shown in FIG. 3, in the embodiment that the SAR ADC 110 is a 4-bit ADC, the digital codes are distributed in a range of 0000 through 1111. Therefore, in the situation that the SAR ADC 110 is an M-bit ADC, the digital codes are distributed in a range of binary numbers corresponding to decimal numbers of 0 through ($2^M-1$). The code density examination module 130 calculates the predetermined code density and the predetermined bias value according to the position of the target group at the range of the binary numbers.

In the embodiment that the input signal Vin is a ramp signal, when the target group (e.g., the first digital code group 0101 through 1000) are selected, the code density examination module 130 selects other digital code groups (e.g., the second digital code group 0000 through 0100 and the third digital code group 1001 through 1100) according to the position of the target group at the range of binary numbers. Then, the code density examination module 130 averages the average code densities of the selected other digital code groups to generate the predetermined code density. The code density examination module 130 further divides the predetermined code density by two to generate the predetermined bias value.

In the embodiment that the input signal Vin is a sine wave signal, the method for generating the predetermined code density is similar to the embodiment that the input signal Vin is a ramp wave signal. The different is that, the code density examination module 130 determines the method for generating the predetermined bias value in accordance with the position of the target group at the range of the binary numbers. If the target group locates at the middle of the range of the binary numbers (e.g., the range of 0101 through 1011 within the range of 0000 through 1111), the code density examination module 130 divides the predetermined code density by two to generate the predetermined bias value. On the other hand, if the target value locates at the edge of the range of the binary numbers (e.g., the range of 0001 through 0010 or 1100 through 1111 within the range of 0000 through 1111), the code density examination module 130 divides the predetermined code density by two thirds to generate a larger bias value because of larger variations of the code densities at the two edges of the bathtub distribution.

In operation S212, the code density examination module 130 compares the average code density of the target group with the predetermined code density. If the difference between the average code density of the target group and the predetermined code density is larger than the predetermined bias value, the code density examination module 130 determines that some digital codes in the target group have erroneous code densities. On the contrary, if the difference between the average code density of the target group and the predetermined code density is smaller than the predetermined bias value, the code density examination module 130 determines that the digital codes in the target group have regular code densities.

The operations S210-S212 will be further described in the following by reference to multiple embodiments. Referring to FIG. 3, in one embodiment, the multiple selected digital codes comprise digital codes 0000 through 1100. The target group, having an average code density of 3.75, comprises digital codes 0101 through 1000. The code density examination module 130 may calculate the predetermined code density and the predetermined bias value according to two other digital code groups adjacent to the target group (e.g., two digital code groups comprise digital codes 0000 through 0100 and 1001 through 1100, respectively). The following Table 1 shows the related calculation results of the predetermined code density and the predetermined bias value.

TABLE 1

| digital code | average code density | predetermined code density | predetermined bias value |
|---|---|---|---|
| 0001 | 4 | 3.875 | 1.875 |
| 0010 | | | |
| 0011 | | | |
| 0100 | | | |
| 1001 | 3.75 | | |
| 1010 | | | |
| 1011 | | | |
| 1100 | | | |

Since the absolute value of the difference (e.g., 0.125) between the average code density of the target group (e.g., 3.75) and the predetermined code density (e.g., 3.875) is smaller than the predetermined bias value (e.g., 1.875), the code density examination module 130 would determine that the digital codes in the target group have regular code densities.

Referring to FIG. 3, in another embodiment, the multiple selected digital codes comprise digital codes 0000 through 1100. The target group, having an average code density of 6, comprises only one digital code 0110. The code density examination module 130 may calculate the predetermined code density and the predetermined bias value according to two other digital code groups adjacent to the target group (e.g., two digital code groups comprise digital codes 0100 through 0101 and 0111 through 1000, respectively). The following Table 2 shows the related calculation results of the predetermined code density and the predetermined bias value.

TABLE 2

| digital code | average code density | predetermined code density | predetermined bias value |
|---|---|---|---|
| 0100 | 3 | 3.25 | 1.625 |
| 0101 | | | |
| 0111 | 3.5 | | |
| 1000 | | | |

Since the absolute value of the difference (2.75) between the average code density of the target group (e.g., 6) and the predetermined code density (e.g., 3.25) is larger than the predetermined bias value (e.g., 1.625), the code density examination module 130 would determine that the digital codes in the target group have erroneous code densities.

In yet another embodiment, the multiple selected digital codes comprise digital codes 0000 through 1100. The target group, having an average code density of 4, comprises only one digital code 1010. The code density examination module 130 may calculate the predetermined code density and the predetermined bias value according to two other digital code groups adjacent to the target group (e.g., two digital code groups comprise digital codes 1100 through 1011 and 1001 through 1000, respectively). The following Table 3 shows the related calculation results of the predetermined code density and the predetermined bias value.

TABLE 3

| digital code | average code density | predetermined code density | predetermined bias value |
|---|---|---|---|
| 1100 | 4 | 3.75 | 1.875 |
| 1011 | | | |
| 1001 | 3.5 | | |
| 1000 | | | |

Since the absolute value of the difference (e.g., 0.25) between the average code density of the target group (e.g., 4) and the predetermined code density (e.g., 3.75) is smaller than the predetermined bias value (e.g., 1.875), the code density examination module 130 would determine that the digital codes in the target group have regular code densities.

In operation S214, the code density examination module 130 outputs calibration information comprising the comparison results to the capacitor calibration module 140. Then, the capacitor calibration module 140 conducts the operation S216 to determine whether to calibrate the capacitance of the capacitor array 112 according to the calibration information received from the code density examination module 130.

When the capacitor calibration module 140 receives the calibration information representing that the digital codes in the target group having regular code densities, the capacitor calibration module 140 would not calibrate the capacitance of the capacitor array 112. In this situation, the calibration system 100 may conduct the operation S202 repeatedly to realize real-time calibration during the operation of the SAR ADC 110.

In some embodiments, the calibration system 100 may terminate the calibration method 200 after determining the digital codes in the target group having regular code densities.

On the contrary, when the capacitor calibration module 140 receives the calibration information representing that the digital codes in the target group having erroneous code densities, the capacitor calibration module 140 conducts operation S218 of FIG. 2B. As a result, the capacitor calibration module 140 selects, according to the position of the target group at the range of binary numbers, one of the capacitor elements 118 of the capacitor array 112 as an under-correction capacitor element to perform the capacitance calibration. The operation of the capacitor calibration module 140 will be further described in the following paragraphs.

In some embodiments, the capacitor calibration module 140 stores multiple binary dividing points. The multiple binary dividing points are generated by dividing the range of binary numbers according to powers of 2 in an ascending manner. For example, in an embodiment that the SAR ADC 110 is a 4-bit ADC so that the digital codes are distributed in the range of 0000 through 1111, the capacitor calibration module 140 dividing the range of 0000 through 1111 according to the first to fourth power of two. When the range of binary numbers is divided according to the first power of two, the capacitor calibration module 140 obtains a binary dividing point equally dividing the range of binary numbers into two sections. When the range of binary numbers is divided according to the second power of two, the capacitor calibration module 140 obtains three binary dividing points equally dividing the range of binary numbers into four sections, and so forth. When the range of binary numbers is divided according to the third and fourth powers of two, the capacitor calibration module 140 obtains seven and fifteen binary dividing points equally dividing the range of binary numbers, respectively.

Accordingly, in the situation that the SAR ADC 110 is a M-bit ADC, the capacitor calibration module 140 stores multiple binary dividing points generated by equally dividing the range of binary numbers according to the first through M-th powers of two.

Please refer to FIG. 1, among the M capacitor elements 118 of the capacitor array 112, the capacitor element 118-1 has the largest capacitance, the capacitor element 118-2 has the second-largest capacitance, the capacitor element 118-M has the smallest capacitance, and so forth. The capacitor calibration module 140 determines a binary dividing point, which is the most adjacent to the position of the target group at the range of the binary numbers, from the multiple binary dividing points. The capacitor calibration module 140 further selects a capacitor element 118, corresponding to the determined binary dividing point, as the under-correction capacitor element.

For example, in an embodiment that the SAR ADC 110 is a 4-bit ADC and the target group comprises one digital code 1000, the location of the target group is most adjacent to a dividing point which equally dividing the range of 0000 through 1111 into two sections. Therefore, the capacitor calibration module 140 selects the capacitor element 118-1 as the under-correction capacitor element.

In another embodiment that the SAR ADC 110 is a 4-bit ADC and the target group comprises one digital code 1100, the location of the target group is most adjacent to one of the dividing points equally dividing the range of 0000 through 1111 into four sections. Therefore, the capacitor calibration module 140 selects the capacitor element 118-2 as the under-correction capacitor element.

That is, if the location of the target group is most adjacent to a dividing point corresponding to the X-th power of 2, the capacitor calibration module 140 selects a capacitor element 118-X as the under-correction capacitor element, and X is a positive integer smaller or equal to M.

After that, the capacitor calibration module 140 conducts the operation S220 to determine the calibration direction for the capacitance of the under-correction capacitor element. When the capacitor calibration module 140 determines, according to the received comparison result, that the average code density of the target group is larger than the predetermined code density, the capacitor calibration module 140 further determines that the capacitance of the under-correction capacitor element needs to be reduced. On the other hand, when the capacitor calibration module 140 determines, according to the received comparison result, that the average code density of the target group is smaller than the predetermined code density, the capacitor calibration module 140 further determines that the capacitance of the under-correction capacitor element needs to be increased.

In operation S222, the capacitor calibration module 140 transmits a calibration command to the SAR ADC 110. The calibration command comprises the calibration direction for the capacitance of the under-correction capacitor element. In the operation S224, the SAR ADC 110 calibrates the capacitance of the under-correction capacitor element according to the received calibration command.

Figure 5:
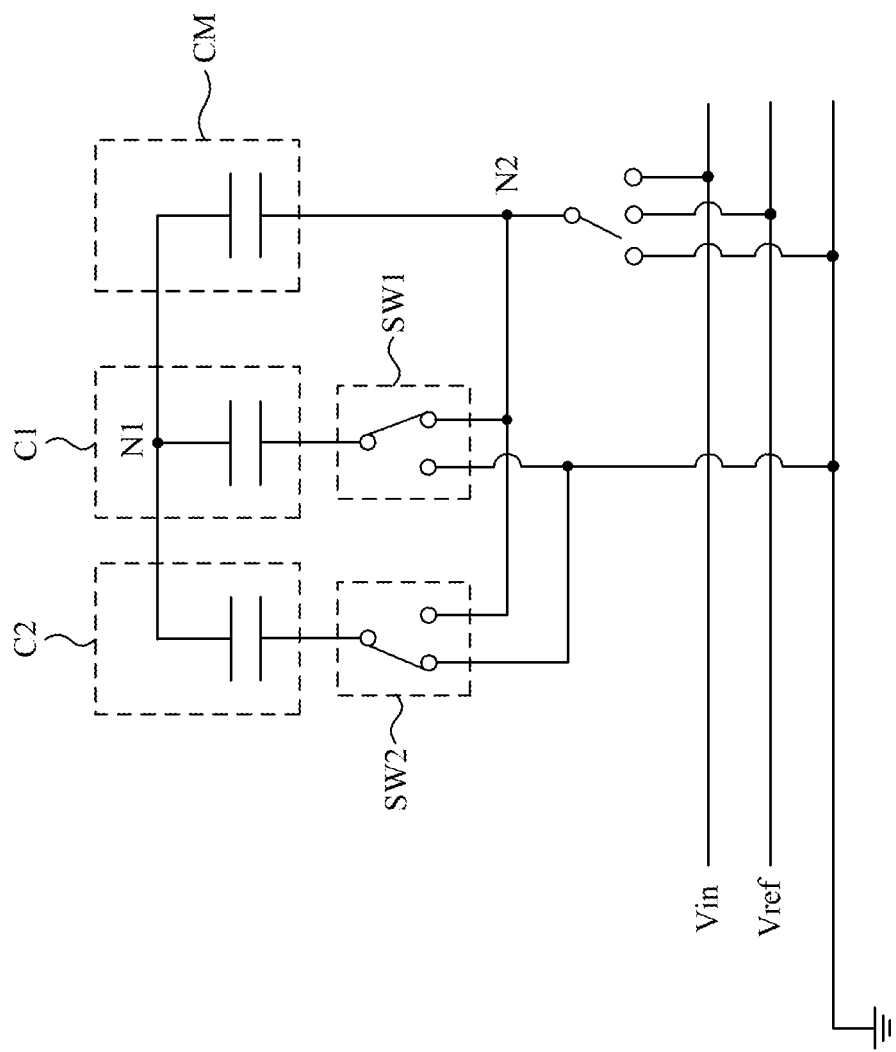
FIG. 5 is a schematic diagram of a capacitor element of FIG. 1 according to one embodiment of the present disclosure.

The calibration method in operation S224 for the capacitance of the under-correction capacitor element will be further described in the following by reference to FIG. 5. Taking capacitor element 118-1 as an example, as shown in FIG. 5, the capacitor element 118-1 comprises a main capacitor CM, a first sub-capacitor C1, a second sub-capacitor C2, a first single-pole double-throw (SPDT) switch SW1, and a second SPDT switch SW2. The main capacitor CM is coupled between the first nodal point N1 and the second nodal point N2. The first node of the first sub-capacitor C1 is coupled with the first nodal point N1, the second node of the first sub-capacitor C1 is coupled with the second nodal point N2 through the first SPDT switch SW1. The first node of the second sub-capacitor C2 is coupled with the first nodal point N1, and the second node of the second sub-capacitor C2 is coupled with the ground through the second SPDT switch SW2.

In other words, the main capacitor CM is coupled with the first sub-capacitor C1 in a parallel connection, and the main capacitor CM does not connect with the second sub-capacitor C2 in the parallel connection.

When the capacitor element 118-1 is selected as the under-correction capacitor element, if the average code density of the target group is smaller than the predetermined code density, the SAR ADC 110 may receive, in operation S224, a calibration command for increasing the capacitance of the capacitor element 118-1. In this situation, the SAR ADC 110 uses the second SPDT switch SW2 to switch the second node of the second sub-capacitor C2 from the ground to the second nodal point N2.

That is, when the average code density of the target group is smaller than the predetermined code density, the SAR ADC 110 couples the second sub-capacitor C2 with the main capacitor CM in another parallel connection to increase the capacitance of the capacitor element 118-1.

On the contrary, if the average code density of the target group is larger than the predetermined code density, the SAR ADC 110 receive, in operation S224, the calibration command for reducing the capacitance of the capacitor element 118-1. In this situation, the SAR ADC 110 uses the first SPDT switch SW1 to switch the second node of the first sub-capacitor C1 from the second nodal point N2 to the ground.

That is, when the average code density of the target group is larger than the predetermined code density, the SAR ADC 110 disconnects the parallel connection of the first sub-capacitor C1 and the main capacitor CM to reduce the capacitance of the capacitor element 118-1.

In some embodiment, capacitor element 118-1 comprises multiple first sub-capacitors C1, multiple second sub-capacitors C2, multiple first SPDT switches SW1, and/or multiple second SPDT switches SW2. Each of the first sub-capacitors C1 is coupled with the main capacitor CM in a parallel connection through a corresponding first SPDT switch SW1. On the other hand, the multiple second sub-capacitors C2 are not coupled with the main capacitor CM in parallel connections. In each time the calibration method 200 is executed, the calibration system 100 may follow the foregoing descriptions to disconnect the parallel connection of one of the multiple first sub-capacitors C1 and the main capacitor CM, or couple one of the multiple second sub-capacitors C2 with the main capacitor CM in another parallel connection. As a result, the precision of the calibration method 200 is increased.

The foregoing descriptions regarding the implementations, connections, calibration methods, and related advantages of the capacitor element 118-1 are also applicable to other capacitor elements 118 of the capacitor array 112. For the sake of brevity, those descriptions will not be repeated here.

After the operation S224 is finished, the calibration system 100 may conduct the operation S202 again to realize the real-time calibration for the SAR ADC 110.

In one embodiment, the calibration system 100 terminates the calibration method 200 after the operation S224 is finished.

In another embodiment, the calibration system 100 conducts the operations S210 through S220 for multiple times. That is, the calibration system 100 selects multiple target groups form the selected digital codes, and compares the average code densities of the target groups with corresponding predetermined code densities, respectively. Therefore, multiple comparison results are generated. Then, the calibration system 100 conducts the operation S222 to output multiple calibration commands according to the multiple comparison results, respectively. As a result, the calibration system 100 calibrates the capacitance of multiple under-correction capacitor elements, which are corresponding to the multiple target groups, in one single execution of the calibration method 200.

For example, the calibration system 100 may select a first target group and a second target group from the multiple digital code groups. Next, the calibration system 100 may compare the average code density of the first target group with a first predetermined code density to generate a first comparison result, and compare the average code density of the second target group with a second predetermined code density to generate a second comparison result. The calibration system 100 outputs the calibration commands according to the first comparison result and the second comparison result. As a result, the calibration system 100 calibrates, in one single execution, the first under-correction capacitor element corresponding to the first target group and the second under-correction capacitor element corresponding to the second target group. In other words, when the capacitor calibration module 140 calibrates the capacitance of the first under-correction capacitor element according to the first comparison result, the capacitor calibration module 140 also calibrates the capacitance of the second under-correction capacitor element according to the second comparison result.

As can be appreciated from the foregoing descriptions, during the regular operations of the SAR ADC 110, the calibration system 100 is capable of executing the calibration method 200 in parallel. Therefore, the real-time calibration for the SAR ADC 110 is achieved. The output errors of the SAR ADC 110, which are caused by various reasons during the regular operation or the manufacture process, are also compensated.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the disclosure will be apparent to those skilled in the art from consideration of the specification and practice of the disclosure disclosed herein. It is intended that the specification and examples be considered as exemplary only, with a true scope and spirit of the disclosure being indicated by the following claims.

What is claimed is:

1. A calibration method, applicable for a SAR ADC comprising a capacitor array, comprising:

Inputting an input signal to the SAR ADC, wherein the SAR ADC is configured to generate an output signal according to the input signal, and the output signal comprises multiple selected digital codes;

calculating average code densities for multiple digital code groups, respectively, wherein the multiple digital code groups are determined by dividing the multiple selected digital codes, and each of the multiple digital code groups comprises one or more selected digital codes of the multiple selected digital codes;

comparing an average code density of a first target group selected from the multiple digital code groups with a first predetermined code density to generate a first comparison result; and calibrating capacitance of a first under-correction capacitor element of the capacitor array according to the first comparison result.

2. The method of claim 1, wherein the operation of calculating average code densities for multiple digital code groups comprises:

calculating a total number of appearances of a first digital code group appearing in the output signal to obtain a first cumulative number, wherein the first digital code group is selected from the multiple selected digital codes;

calculating, according to the first cumulative number, a first average code density of the first digital code group corresponding to the output signal;

calculating a total number of appearances of a second digital code group appearing in the output signal to obtain a second cumulative number, wherein the second digital code group is selected from the multiple selected digital codes; and calculating, according to the second cumulative number, a second average code density of the second digital code group corresponding to the output signal.

3. The method of claim 1, wherein when the average code density of the first target group is larger than the first predetermined code density, the capacitance of the first under-correction capacitor element is reduced, and when the average code density of the first target group is smaller than the first predetermined code density, the capacitance of the first under-correction capacitor element is increased.

4. The method of claim 3, further comprising:

comparing an average code density of a second target group selected from the multiple digital code groups with a second predetermined code density to generate a second comparison result, wherein the operation of calibrating the capacitance of the first under-correction capacitor element of the capacitor array according to the first comparison result comprises:

when calibrating the capacitance of the first under-correction capacitor element, calibrates capacitance of a second under-correction capacitor element of the capacitor array according to the second comparison result, wherein when the average code density of the second target group is larger than the second predetermined code density, the capacitance of the second under-correction capacitor element is reduced, and when the average code density of the second target group is smaller than the second predetermined code density, the capacitance of the second under-correction capacitor element is increased.

5. The method of claim 3, wherein the first under-correction capacitor element comprises a main capacitor, a first sub-capacitor, and a second sub-capacitor, the first sub-capacitor is coupled with the main capacitor in a parallel connection, and the operation of calibrating the capacitance of the first under-correction capacitor element of the capacitor array according to the first comparison result further comprises:

when the average code density of the first target group is larger than the first predetermined code density, disconnecting the parallel connection of the first sub-capacitor and the main capacitor; and when the average code density of the first target group is smaller than the first predetermined code density, coupling the second sub-capacitor with the main capacitor in another parallel connection.

6. The method of claim 1, wherein the multiple selected digital codes are distributed in a range of binary numbers, and the operation of comparing the average code density of the first target group selected from the multiple digital code groups with the first predetermined code density comprises:

when the first target group is selected, selecting, according to a location of the first target group at the range of binary numbers, other digital code groups adjacent to the first target group from the multiple digital code groups; and averaging average code densities of the other digital code groups to obtain the first predetermined code density.

7. The method of claim 6, wherein the capacitor array comprises M capacitor elements, M is a positive integer, and the operation of calibrating the capacitance of the first under-correction capacitor element of the capacitor array according to the first comparison result comprises:

dividing the range of binary numbers according to powers of two in an ascending manner to obtain multiple binary dividing points;

determining a first dividing point in the multiple binary dividing points most adjacent to the location of the first target group at the range of binary numbers; and selecting, according to one of the powers of two corresponding to the first dividing point, one of the M capacitor elements as the first under-correction capacitor element.

8. A calibration system, comprising:

a SAR ADC, comprising a capacitor array, and configured to generate an output signal according to an input signal, wherein the output signal comprises multiple selected digital codes;

a code density calculation module, configured to receive the output signal, and to calculate average code densities for multiple digital code groups, respectively, wherein the multiple digital code groups are determined by dividing the multiple selected digital codes, and each of the multiple digital code groups comprises one or more selected digital codes of the multiple selected digital codes;

a code density examination module, configured to compare an average code density of a first target group selected from the multiple digital code groups with a first predetermined code density, and to output a first comparison result; and a capacitor calibration module, coupled with the capacitor array, and configured to calibrate capacitance of a first under-correction capacitor element of the capacitor array according to the first comparison result.

9. The calibration system of claim 8, wherein the code density calculation module conducts multiple operations to calculate the average code densities for the multiple digital code groups, the multiple operations comprise:

calculating a total number of appearances of a first digital code group appearing in the output signal to obtain a first cumulative number, wherein the first digital code group is selected from the multiple selected digital codes;

calculating, according to the first cumulative number, a first average code density of the first digital code group corresponding to the output signal;

calculating a total number of appearances of a second digital code group appearing in the output signal to obtain a second cumulative number, wherein the second digital code group is selected from the multiple selected digital codes; and calculating, according to the second cumulative number, a second average code density of the second digital code group corresponding to the output signal.

10. The calibration system of claim 8, wherein when the average code density of the first target group is larger than the first predetermined code density, the capacitor calibration module reduces the capacitance of the first under-correction capacitor element, and when the average code density of the first target group is smaller than the first predetermined code density, the capacitor calibration module increases the capacitance of the first under-correction capacitor element.

11. The calibration system of claim 10, wherein the code density examination module is configured to compare an average code density of a second target group selected from the multiple digital code groups with a second predetermined code density, and to output a second comparison result, wherein when the capacitor calibration module calibrates the capacitance of the first under-correction capacitor element according to the first comparison result, the capacitor calibration module calibrates capacitance of a second under-correction capacitor element of the capacitor array according to the second comparison result, wherein when the average code density of the second target group is larger than the second predetermined code density, the capacitor calibration module reduces the capacitance of the second under-correction capacitor element, and when the average code density of the second target group is smaller than the second predetermined code density, the capacitor calibration module increases the capacitance of the second under-correction capacitor element.

12. The calibration system of claim 10, wherein the first under-correction capacitor element comprises:

a main capacitor;

a first sub-capacitor, wherein the first sub-capacitor is coupled with the main capacitor in a parallel connection; and a second sub-capacitor, wherein when the average code density of the first target group is larger than the first predetermined code density, the capacitor calibration module disconnects the parallel connection of the first sub-capacitor and the main capacitor, when the average code density of the first target group is smaller than the first predetermined code density, the capacitor calibration module couples the second sub-capacitor with the main capacitor in another parallel connection.

13. The calibration system of claim 8, wherein the multiple selected digital codes is distributed in a range of binary numbers, when the first target group is selected, the code density examination module selects, according to a location of the first target group at the range of binary numbers, other digital code groups adjacent to the first target group from the multiple digital code groups, wherein the code density examination module averages average code densities of the other digital code groups to obtain the first predetermined code density.

14. The calibration system of claim 13, wherein the capacitor array comprises:

M capacitor elements, wherein M is a positive integer, wherein the capacitor calibration module stores multiple binary dividing points obtained by dividing the range of binary numbers according to powers of two in an ascending manner, wherein the capacitor calibration module determines a first dividing point in the multiple binary dividing points most adjacent to the location of the first target group at the range of binary numbers, and selects, according to one of the powers of two corresponding to the first dividing point, one of the M capacitor elements as the first under-correction capacitor element.

* * * * *